United States Patent [19]

Honma et al.

[11] Patent Number: 4,792,842
[45] Date of Patent: Dec. 20, 1988

[54] SEMICONDUCTOR DEVICE WITH WIRING LAYER USING BIAS SPUTTERING

[75] Inventors: Yoshio Honma, Nishitama; Sukeyoshi Tsunekawa, Tokorozawa; Natsuki Yokoyama, Mitaka; Hiroshi Morisaki, Hachioji, all of Japan

[73] Assignee: Hitachi, Ltd., Tokyo, Japan

[21] Appl. No.: 129,393

[22] Filed: Nov. 24, 1987

Related U.S. Application Data

[63] Continuation of Ser. No. 756,256, Jul. 18, 1985, abandoned.

[30] Foreign Application Priority Data

Jul. 18, 1984 [JP] Japan .................. 147510/84

[51] Int. Cl.$^4$ ............................ H01L 23/48
[52] U.S. Cl. .......................... 357/71; 357/65; 357/68
[58] Field of Search .................. 357/71 R, 65, 68

[56] References Cited

U.S. PATENT DOCUMENTS

| | | | |
|---|---|---|---|
| 4,158,613 | 6/1979 | Sogo | 357/71 X |
| 4,161,430 | 7/1979 | Sogo | 357/71 X |
| 4,271,424 | 6/1981 | Inayoshi et al. | 357/71 X |

OTHER PUBLICATIONS

Reuitz et al., "Metallurgy Barrier for Au and Pb," *IBM Technical Disclosure Bulletin*, vol. 14, No. 11, Apr. 1972, p. 3358.

Chapman, "Fabricating Ohmic Contacts," *IBM Technical Disclosure Bulletin*, vol. 9, No. 4, Sep. 1966, pp. 431-431.

Ting, "Tin Formed by Evaporation as a Diffusion Barrier Between Al and Si", *J. Vac. Sci. Technol.*, 21(1) May/Jun. 1982, pp. 14-18.

*Primary Examiner*—Andrew J. James
*Assistant Examiner*—William A. Mintel
*Attorney, Agent, or Firm*—Antonelli, Terry & Wands

[57] ABSTRACT

Disclosed is a semiconductor device and method for manufacturing the same, which is provided with a first wiring layer whose thickness within a contact hole is great in a lower portion of the contact hole and is small in an upper portion thereof. Since the first wiring layer at the lower portion of the contact hole is sufficiently thick, reaction between a second wiring layer formed on the first wiring layer and a substrate is effectively prevented. The first wiring layer is formed by bias sputtering in which a bias voltage is applied to the substrate.

21 Claims, 1 Drawing Sheet

SEMICONDUCTOR DEVICE WITH WIRING LAYER USING BIAS SPUTTERING

This application is a continuation application of application Ser. No. 756,256, filed July 18, 1985 now abandoned.

BACKGROUND OF THE INVENTION

The present invention relates to a semiconductor device and method for manufacturing the same; and more particularly to such device, and method such for manufacturing the same, which has a highly reliable wiring in a contact hole portion.

With a trend toward higher density of integration of a semiconductor integrated circuit, connecting portions of a wiring (such as a connecting portion between a wiring and a semiconductor substrate, a connecting portion between an upper layer wiring and a lower layer wiring, etc.) formed for connection between elements and the like are extremely reduced in dimension.

The above-described connection is made through a contact hole formed in an insulating film, but a ratio of a depth to a diameter (or a narrower width) of a contact hole (hereinafter referred to as "aspect ratio") also gradually increases with higher density of integration.

As a result, there occurs a tendency in that a defective connection is liable to occur to deteriorate the reliability of the wiring.

A proposal has been made to provide a dual layer construction of a wiring in order to prevent the reliability from being deteriorated as described above.

FIG. 1a shows one example of such proposal, in which a wiring of a dual layer construction comprising a first wiring layer 12 and a second wiring layer 13 is shown (C. Y. Ting, J. Vac. Sci. Technol., 21 (1) 1982, P14–P18).

The first wiring layer 12, of transition metal W or Mo, or alloys or compounds thereof such as TiW or TiN, is provided to prevent occurrence of reaction between the second wiring layer 13, formed of alloy containing Al as a main component, and a substrate 10 within a contact hole 14.

However, since the first and second wiring layers 12, 13 are formed by vacuum evaporation or sputtering, the wiring layer 12 is extremely thin in a bottom end portion A of a contact hole 14 formed in an insulating film 11.

The degree of such thinness is affected by the aspect ratio of the contact hole 14, the method of forming the first wiring layer 12, and the and film thickness thereof. For example, where the aspect ratio of the contact hole is 1, a step coverge factor (a ratio of film thickness between a thick portion of a wiring layer and a thin portion thereof in the contact hole) is 0.1 to 0.5.

If in the end portion A, the thickness of the first wiring layer 12 is reduced as described above, the effect of preventing the reaction between the second wiring layer 13 and the substrate 10 is lowered and the reliability of the wiring is lowered.

Further, not only the thickness of the first wiring layer 12 but the thickness of the second wiring layer 13 becomes thin in the end portion A for the same reason as described above, and therefore, current capacity of wiring (maximum current amount that may be applied to the wiring) is also lowered.

To solve the problem noted above, a method has been proposed wherein a first wiring layer 12' is formed interiorly of a contact hole 14 by selective chemical vapor deposition (hereinafter referred to as "selective CVD"), as shown in FIG. 1b, (C. E. Miller, Solid State Technol., December 1982, 85).

According to this method, the first wiring layer 12' of transition metal such as W, Mo, etc. is selectively formed within the contact hole, so as to be embedded in the contact hole 14, after which a second wiring layer 13' is formed by sputtering or the like.

As clearly shown in FIG. 1b, the first wiring layer 12' is almost completely embedded in the contact hole 14, and therefore, the step coverage of the second wiring layer 13' and current capacity are improved over those shown in FIG. 1a.

However, as shown in FIG. 1b, since the side of the first wiring layer 12' formed by the selective CVD and the side of the insulating film 11 are not in close contact with each other but there is a gap therebetween, the thickness of the first wiring layer 12' becomes thin in the end portion A' similarly to the case shown in FIG. 1a, and the effect of preventing the reaction between the second wiring layer 13' and the substrate 10 is lowered, thus making it difficult to obtain a good wiring. Furthermore, three of the present inventors have proposed a method wherein a contact hole is filled with a first metal and thereafter a second metal layer is formed (see Japanese Patent Laid-Open No. 152192/82). However, it has been desired to develop a simpler and more practical method.

SUMMARY OF THE INVENTION

It is an object of the present invention to provide a semiconductor device and method for manufacturing the same in which even if a dimension of a contact hole is made extremely small, a wiring having a high reliability is obtained, while overcoming those problems noted above with respect to prior art.

To achieve the aforementioned object, the present invention provides an arrangement wherein a thickness of a first wiring layer is made, on a side wall of a contact hole, to be gradually increased from an upper portion toward a lower portion, to thereby effectively prevent a reaction between a second wiring layer and a substrate in a bottom end of the contact hole.

DETAILED DESCRIPTION OF THE PREFERRED EMBODIMENTS

As described above, in the present invention, a first wiring layer is provided to prevent a reaction between a semiconductor substrate at a bottom of a contact hole and a second wiring layer, and in the first wiring layer, a portion formed on the lower portion of the side wall of the contact hole is made thicker in thickness than that of a portion formed on the upper portion of the side wall of the contact hole.

Figure 1A:
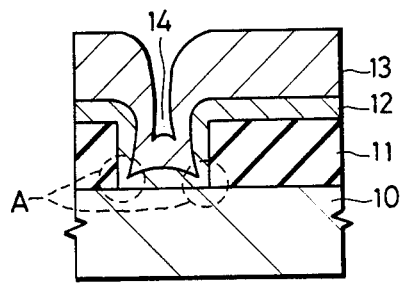
FIGS. 1a and 1b are respectively views showing a sectional construction of a conventional wiring.
Figure 1B:
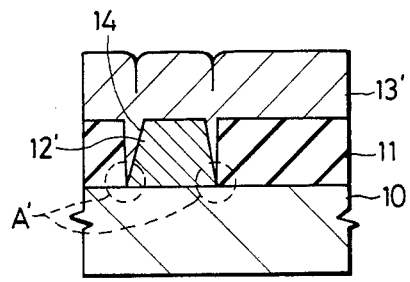
Figure 2A:
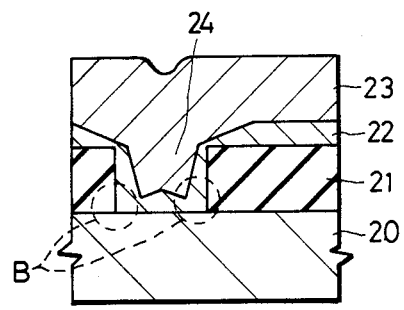
FIGS. 2a and 2b are respectively views showing a sectional construction of different embodiments of the present invention.

More specifically, as in one example shown in FIG. 2a, an insulating film 21 having a contact hole 24, a first wiring layer 22 and a second wiring layer 23 are formed on a semiconductor substrate 20, and the first wiring layer 22 within the contact hole 24 has a thickness thicker in a lower portion thereof than that in an upper portion thereof. As seen in FIG. 2a, the side wall of the contact hole 24, formed by insulating film 21, is substantially perpendicular to the substrate.

Therefore, as is clear from FIG. 2a, the thickness of the first wiring layer 22 in the lower end portion B of the contact hole 24 is extremely thick to effectively prevent a contact between the second wiring layer 23 and the semiconductor substrate 20 and reaction therebetween at the lower end portion B.

The wiring layer, within the contact hole, having a thickness of which the lower portion is great while that of the upper portion is small, can be formed by a method called "bias sputtering".

As is known, normal sputtering comprises a method of directing high speed ions (such as helium ion, neon ion, etc.) against a source target formed of material for forming a wiring, wherein a material constituting the source target is ejected therefrom, and accumulating the material ejected from the source target on a substrate arranged opposed to the source target, thus forming a film formed of said material on the substrate.

The bias sputtering used in the present invention is characterized in that independent voltages are applied to both the source target and a substrate holder on which a semiconductor substrate is placed, respectively, as shown in C. Y. Ting, et al., J. Vac. Sci. Technol. 15 (3), May/June 1978, P.1105–P.1112. (This method is called "bias sputtering" because not only is a voltage applied to a source target, but also a bias voltage is applied to a substrate holder.)

Figure 3:
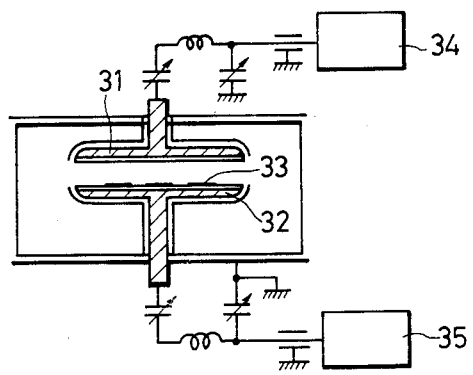
FIG. 3 is a schematic view for explanation of bias sputtering used in the present invention.

FIG. 3 is a schematic view showing one example of such method. Independent power supplies (R. F. generator) 34, 35 are connected to an upper target (source target) 31 and a lower target (substrate holder) 32, respectively, and a film formed of a material constituting the source target 31 is formed on a semiconductor substrate 33 placed on the substrate holder 32.

The present inventors have found that when a wiring layer is formed by the bias sputtering, the material is thickly accumulated on the lower portion of the side wall of the contact hole as shown in FIG. 2a. They have further found that the wiring layer formed by the bias sputtering is far denser than the wiring formed by other methods such as normal sputtering or vacuum evaporation, and, in addition, the adhesiveness with respect to the semiconductor and insulating film is far superior thereto.

The present invention has been achieved on the basis of novel concept as described above. At least the first wiring layer is formed by bias sputtering, whereby a wiring of extremely high reliability can be formed.

Needless to say, the second wiring layer formed on the first wiring layer can be formed by various known methods such as normal sputtering, vacuum evaporation, etc. However, if the bias sputtering is used, rugged portions on the upper surface are advantageously reduced.

EMBODIMENT 1

As shown in FIG. 2a, an insulating film 21 (SiO$_2$) having a thickness of 1 $\mu$m is formed on a silicon substrate 20 by a known thermal oxidation method, and a square contact hole 24 having a length of one side of 1 $\mu$m is formed by a known photoetching method.

By the bias sputtering, tungsten is accumulated in an opening portion 24 and on the insulating film 22 to form a first wiring layer 22 formed of tungsten.

When the bias sputtering is carried out under the condition of a resputtering rate of 50% to form the tungsten film 22 whose thickness in a flat portion is 0.2 $\mu$m, the thickness in the lower end portion B of the contact hole 24 is more than 0.3 $\mu$m. This thickness of 0.3 $\mu$m is four to five times the thickness in the case where a tungsten film is formed by normal sputtering.

Next, Al-Cu alloy (Cu 3%) having a thickness of 1 $\mu$m is formed under the same condition as that of the tungsten film by the bias sputtering to form a second wiring layer 23.

According to the above-described embodiment, the thickness of the first wiring layer 22 in the lower end portion B of the contact hole 24 is extremely great, that is, four to five times that of the prior art, and, therefore, the reaction between the second wiring layer 23 and the silicon substrate 20 is completely prevented and the lifetime of the wiring is improved by more than twice over the case where formation of the first wiring layer having a thickness of 0.2 $\mu$m is performed by normal sputtering.

The aforesaid resputtering rate is represented by (a−b)/a, where a is the accumulated amount on the substrate when sputtering is carried out by not applying a voltage to the substrate holder 32 but applying a voltage only to the source target 31, and b is the accumulated amount on the substrate when sputtering is carried out by applying a voltage to both substrate holder 32 and source target 31.

The resputtering rate can be adjusted to the desired value by varying the voltage (electric power) applied to the substrate holder 32 and/or source target 31. While FIG. 3 shows the case where R.F. power supplies 34, 35 are connected to substrate holder 32 and source target 31, respectively, it should be noted that a DC power supply can be connected to the source target 31.

EMBODIMENT 2

An insulating film 21 having a contact hole 24 is formed in a manner the same as that of the embodiment 1.

A TiN film 22b is formed by the bias sputtering under the condition of resputtering rate of 80%. However, where the resputtering rate is as great as 80%, the surfaces of the substrate 20 and insulating film 21 are etched and fine particles caused by etching are entered into the FiN film 22b to possibly deteriorate the purity of the TiN film 22b. Therefore, TiN film 22a having a thickness of 0.05 $\mu$m is formed by the normal sputtering in advance and then the TiN film 22b is formed thereon by the bias sputtering to thereby form a first wiring layer having a thickness of 0.2 $\mu$m in total.

Thereafter, a second wiring layer 23 formed of Al-Cu alloy is formed in a manner same to that of the embodiment 2.

Figure 2B:
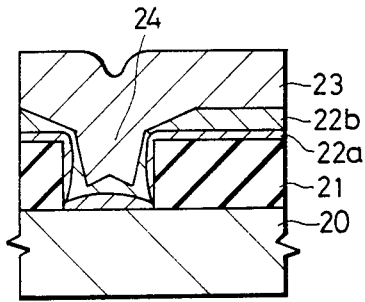

It has been confirmed that as shown in FIG. 2b, the thus obtained wiring is great in thickness in the lower portion in the contact hole 24 to effectively prevent reaction between the second wiring layer 23 and substrate 20, thus providing higher reliability and longer lifetime than devices of the prior art.

It will be noted that the first wiring layers 22a, 22b can be formed of different material, for example, Ti can be used in place of TiN. In either case, it will suffice that the combined thickness of both layers is greater in the lower portion than at the upper portion within the contact hole.

It will be further noted that a silicon substrate is used as a substrate in the above-described embodiment, but other semiconductor substrates, substrates of an insulating material substrate or metal can be used.

Moreover, while the case has been shown in which a contact hole is used to connect a substrate with a wiring layer, it will be noted that the contact hole is not limited thereto but the contact hole can also be used to connect between upper and lower wiring layers.

Furthermore, while in the above-described embodiment the case has been shown in which a first wiring layer is formed on the entire surface, e.g. of an insulating under a second wiring layer, it will be noted that the first wiring layer can be left only within the contact hole and the remaining portion of the first wiring layer, on the insulating film, can be removed. For the second wiring layer, various alloys principally containing Al or Cu such as Al-Si alloy, Al-Mn alloy and others can be used in addition to Al, Al-Cu alloy, etc. Also, a laminated films such as Al./X/Y/Al.Z can be used for the second wiring layer. Here, X, Y, and Z can be a nobel metal other than Al, transition metal or alloys thereof, or nitrides or silicates. Also, X, Y and Z can be of the same kind of material or a different kind of material.

For the first wiring layer, there can be used at least one of various kinds of transition metals such as Ti, W, Mo, Pt, Pd, etc., alloys of those transition metals such as TiW, and various compounds of said transition metals such as titanium nitride, tungsten silicide, etc.

According to the present invention, the second wiring layer within the contact hole is preferably formed by the bias sputtering as described above, and the favorable result may be obtained if the resputtering rate is set to about 50 to 90%. If the resputtering rate is less than 50%, a cavity is sometimes formed in a filling layer. If the resputtering rate is above 90%, the accumulating speed of a film becomes extremely slow.

In the first wiring layer, filling is not made only by the first wiring layer but is formed on the side surface and bottom surface, and therefore, the good result may be obtained by the bias sputtering with the resputtering above about 20%.

If the resputtering rate is less than about 20%, the thickness of the first wiring layer at the lower portion of the contact hole is sometimes insufficient, and therefore, it is preferable to set the resputtering rate to the rate above about 20%. The resputtering rate above 90% is desired to be avoided since the accumulating speed is extremely slow and the etching of the substrate and insulating film becomes conspicuous. Therefore, it is favorable to set the resputtering to about 20% to 90%.

What is claimed is:

1. A semiconductor device comprising at least an insulating film formed on a semiconductor substrate, at least one contact hole formed in a desired portion of said insulating film, the at least one contact hole having a side wall surface that is substantially perpendicular to said semiconductor substrate and having a lower portion adjacent a bottom surface of the contact hole and an upper portion adjacent an upper surface of the insulating film, the upper portion of the contact hole extending to an upper edge adjacent the upper surface of the insulating film, a first wiring layer continuously formed on at least the side wall surface and the bottom surface of said contact hole, from the bottom surface to the upper edge of the upper portion of the contact hole, the first wiring layer comprising a material selected from the group consisting of a transition metal, an alloy including said transition metal, and a compound of said transition metal, and a second wiring layer covering said first wiring layer and extending from said contact hole to said insulating film, said first wiring layer having a film thickness at the lower portion of the contact hole that is greater than the film thickness at the upper portion of said contact hole, the first wiring layer being a wiring layer formed by bias sputtering.

2. The semiconductor device according to claim 1 wherein said second wiring layer is formed of an Al-containing material film selected from the group consisting of an Al film and an alloy film containing Al as a main component.

3. The semiconductor device according to claim 2 wherein said alloy film containing Al as a main component is selected from a group consisting of Al-Cu alloy, Al-Si alloy and Al-Mn alloy.

4. The semiconductor device according to claim 1 wherein said transition metal is at least one selected from a group consisting of Ti, W, Mo, Pt and Pd.

5. The semiconductor device according to claim 1 wherein the first wiring layer extends continuously from the bottom of the contact hole to the upper surface of the insulating film.

6. The semiconductor device according to claim 1 further comprising a conducting material layer positioned between said substrate and said first wiring layer and between the side wall surface of the contact hole and said first wiring layer.

7. The semiconductor device according to claim 6 wherein said conducting material layer is of a material different from the material of the first wiring layer.

8. A semiconductor device comprising at least an insulating film formed on a wiring layer, at least one contact hole formed in a desired portion of said insulating film, the at least one contact hole having a side wall surface that is substantially perpendicular to said wiring layer and having a lower portion adjacent a bottom surface of the contact hole and an upper portion adjacent an upper surface of the insulating film, the upper portion of the contact hole extending to an upper edge adjacent the upper surface of the insulating film, a first wiring layer continuously formed on at least the side wall surface and the bottom surface of said contact hole, from the bottom surface to the upper edge of the upper portion of the contact hole, the first wiring layer comprising a material selected from the group consisting of a transition metal, an alloy including said transition metal, and a compound of said transition metal, and a second wiring layer covering said first wiring layer and extending from said contact hole to said insulating film, said first wiring layer having a film thickness at the lower portion of the contact hole that is greater than the film thickness at the upper portion of the contact hole, said first wiring layer being a wiring layer formed by bias sputtering.

9. The semiconductor device according to claim 8 wherein said second wiring layer is formed of an Al-containing material film selected from the group consisting of an Al film and an alloy film containing Al as a main component.

10. The semiconductor device according to claim 9 wherein said alloy containing Al as a main component is selected from a group consisting of Al-Cu alloy, Al-Si alloy and Al-Mn alloy.

11. The semiconductor device according to claim 8 wherein said transition metal comprises at least one selected from a group consisting of Ti, W, Mo, Pt and Pd.

12. A semiconductor device comprising at least an insulating film formed on a substrate, at least one contact hole formed in a desired portion of said insulating film, the at least one contact hole having a side wall surface, the side wall surface having a lower portion adjacent a bottom surface of the contact hole and an upper portion adjacent an upper surface of the insulating film, the upper portion of the side wall surface extending to an upper edge adjacent the upper surface of the insulating film, a first wiring layer continuously formed on at least said side wall surface and said bottom surface of said contact hole, and a second wiring layer covering said first wiring layer and extending from said contact hole to said insulating film, said first wiring layer having a film thickness at the lower portion of the side wall surface of said contact hole that is greater than the film thickness at the upper portion of said side wall surface, said first wiring layer being a wiring layer formed by bias sputtering.

13. The semiconductor device according to claim 12 wherein the second wiring layer is a layer formed by bias sputtering.

14. The semiconductor device according to claim 12 wherein the bias sputtering of the first wiring layer is performed at a resputtering rate of about 20% to 90%.

15. A semiconductor device comprising at least an insulating film formed on a main surface of a substrate, at least one contact hole formed in a desired portion of said insulating film, the at least one contact hole having a side wall surface, the side wall surface having a lower portion adjacent a bottom surface of the contact hole and an upper portion adjacent an upper surface of the insulating film, the upper portion of the side wall surface extending to an upper edge adjacent the upper surface of the insulating film, the side wall surface of the at least one contact hole extending substantially perpendicularly to said main surface of the substrate, and a conductive material layer continuously provided on at least said side wall surface and said bottom surface of said contact hole, said conductive material layer having a film thickness at the lower portion of the side wall surface of said contact hole that is greater than the film thickness at the upper portion of said side wall surface, said conductive material layer being a conductive material layer formed by bias sputtering.

16. The semiconductor device according to claim 15 wherein the substrate is a semiconductor body.

17. The semiconductor device according to claim 16 wherein the conductive material of the conductive material layer is selected from the group consisting of transition metals and conductive compounds thereof.

18. The semiconductor device according to claim 15 wherein the conductive material layer is a layer formed by bias sputtering at a resputtering rate of 20% to 90%.

19. The semiconductor device according to claim 12 wherein the substrate is a semiconductor body.

20. The semiconductor device according to claim 19 wherein the second wiring layer is a layer formed by bias sputtering.

21. The semiconductor device according to claim 19 wherein the bias sputtering of the first wiring layer is performed at a resputtering rate of about 20% to 90%.

* * * * *